(12) United States Patent
Ogawa

(10) Patent No.: US 7,004,358 B2
(45) Date of Patent: Feb. 28, 2006

(54) DISPENSER

(75) Inventor: Kenji Ogawa, Musashino (JP)

(73) Assignee: Neuberg Company Limited, (JP)

( * ) Notice: Subject to any disclaimer, the term of this patent is extended or adjusted under 35 U.S.C. 154(b) by 285 days.

(21) Appl. No.: 10/600,128

(22) Filed: Jun. 20, 2003

(65) Prior Publication Data

US 2004/0195274 A1 Oct. 7, 2004

(30) Foreign Application Priority Data

Apr. 1, 2003 (JP) ............................. 2003-098421

(51) Int. Cl.
*B67D 5/00* (2006.01)

(52) U.S. Cl. ..................... 222/386; 417/470; 417/269

(58) Field of Classification Search ................ 417/269, 417/470; 222/333, 386
See application file for complete search history.

(56) References Cited

U.S. PATENT DOCUMENTS

| | | | | |
|---|---|---|---|---|
| 2,910,056 A | * | 10/1959 | Sampietro | ................... 123/450 |
| 2,913,911 A | * | 11/1959 | Gilkey | ........................... 74/60 |
| 4,155,683 A | * | 5/1979 | Mochizuki et al. | ......... 417/269 |

FOREIGN PATENT DOCUMENTS

| | | |
|---|---|---|
| JP | 6-129345 | 5/1994 |
| JP | 6-147102 | 5/1994 |
| JP | 8-254177 | 10/1996 |

OTHER PUBLICATIONS

Communication from PCT Office regarding counterpart application.

* cited by examiner

*Primary Examiner*—Michael Mar
*Assistant Examiner*—Sonia N. Khaira
(74) *Attorney, Agent, or Firm*—Harness, Dickey & Pierce, P.L.C.

(57) ABSTRACT

A dispenser has a seal disk (30), a valve member (40), a plunger guide block (50), a motor (3), which rotates a cam-follower guide block (60), and an end cam (5). The seal disk (30) has communication holes (31), (32) and a sliding surface (33). The valve member has a sliding surface (41), three plunger holes (42) and three plungers (80) inserted in the plunger holes. The cam-follower guide block (60) has three guide holes (62) that receive cam followers, which each have a body (70) with a ball (75) within a recess (71). The ball (75) contacts the cam surface (5A) of the cam (5) which causes the cam followers and plungers (80) to move back and forth parallel to the dispenser axis. The coefficient of friction between the ball and the recess is less than that between the ball and the cam surface (5A).

6 Claims, 8 Drawing Sheets

DISPENSER

BACKGROUND OF THE INVENTION

1. Field of the Invention

The present invention relates to a plunger pump that draws and discharges liquid as the plungers reciprocate. More particularly, the invention relates to a dispenser of plunger-pump type, in which three plungers revolve and reciprocate and a planer valve switches the flow of the liquid, thereby to move the liquid in proportion to the revolution of the plungers.

2. Description of the Related Art

A dispenser of plunger-pump type is known, which can discharge in a very small amount with high precision and can apply an adhesive in methods of manufacturing semiconductor devices. (Such dispensers are disclosed in, for example, Japanese Patent Application Laid-Open Publication No. 6-129345.)

This dispenser comprises a body, a valve block and a pump block. The valve block has a sliding surface, at which a communication hole opens. The communication hole communicates with an inlet port and an outlet port. The body supports the pump block, allowing the pump block to rotate. The pump block has a sliding surface at one end. The pump block abuts, at the sliding surface, on the sliding surface of the valve block. The pump block has three plunger holes. These holes can communicate with the communication hole of the valve block and extend in the axial direction of the pump block. While biased onto the valve block, the pump block can rotate to make the plunger holes sequentially communicate with the communication hole. The plungers held in the plunger holes are driven in their axial direction to draw and discharge liquid repeatedly. The dispenser can, therefore, discharge the liquid in an extremely small amount and at a constant rate, without causing a pulsating motion of the liquid.

The dispenser has an end cam, which makes the plungers reciprocate while revolving, and rollers that abut on the end cam. The rollers are used as cam followers. They are coupled to the rods that drive the plunges.

Each roller rotates, while revolving. Inevitably, it rotates at different speeds at the inner and outer ends of the radius of revolution if the plane in which each roller contacts the end cam is flat. Consequently, the roller undergoes lateral sliding. To minimize the wear of the rollers, the end cam is made of oil-impregnated resin or the like. If the end cam made of oil-impregnated resin is used, its surface will deform, reducing the operating precision of the dispenser, i.e., the rate at which the dispenser discharges the liquid.

To prevent the lateral sliding, the roller may have a conical surface. If the roller has a conical surface, however, a thrust will be generated. Consequently, the conventional dispenser must be complex in structure in order to eliminate such a thrust.

Since the axle, on which the roller is mounted to rotate, protrudes from the driving rod, the radius of revolution of the roller cannot be as short as desired. The miniaturization of the dispenser is inevitably limited.

SUMMARY OF THE INVENTION

An object of the present invention is to provide a dispenser that can be simple in structure and small in size and can discharge liquid in a desired amount with high precision.

An dispenser according to this invention comprises: a port member having an inlet port for drawing liquid, an outlet port for discharging the liquid, and a sliding surface in which openings is made, the openings communicating with the inlet port and outlet port, respectively; a valve member having a sliding surface which is to contact the sliding surface of the port member, arranged to rotate with the sliding surface contacting the sliding surface of the port member, and having three plunger holes which extend parallel to an axis of the dispenser and which are arranged equidistantly around the axis of the dispenser; drive portion for rotating the valve member; an end cam having a cam surface of a predetermined profile; and three plungers inserted in the three plunger holes of the valve member, respectively, to move parallel to the axis of the dispenser. In the dispenser, each of the plungers has a semispherical recess made in one end that opposes the cam surface and a ball is fitted in the semispherical recess to contact the cam surface. The coefficient of friction between the ball and the semispherical recess is smaller than the coefficient of friction between the ball and the cam surface. The ball rolls on the cam surface when the valve member is rotated, causing the plunger to move parallel to the axis of the dispenser in accordance with the profile of the cam surface.

In the invention, each cam follower that abuts on the cam surface comprises a plunger member having a recess and a ball held in the recess. The dispenser of this invention can therefore have a smaller diameter than the conventional dispenser that uses rollers. Thus, the dispenser can be miniaturized. In the conventional dispenser, rollers are used, rotatably mounted on axles. The axles protrude from the plunger members provided in the valve member to slide in the axial direction of the dispenser and the rollers are mounted on the axles. Consequently, the locus of revolution of each roller has a large diameter, and the end cam needs to have a diameter that is large in proportion to the diameter of the locus.

With the present invention it suffices to arrange a ball in the recess of each plunger member. No components protrude from the plunger members. The diameter of the locus of revolution of each ball can be small. This helps to miniaturize the dispenser.

In this invention, the coefficient of friction between the ball and the recess of the plunger member is smaller than the coefficient of friction between the ball and the cam surface. Therefore, a force, if any, applied to the ball in the direction perpendicular to the axis of the dispenser will be absorbed as the ball rotates in the recess. The ball would not undergo lateral sliding. Hence, the end cam need not be made of oil-impregnated resin as in the conventional dispenser. It can be made of hard material such as metal. The balls can be made of hard material, too. This reduces the stroke error of each plunger member and ultimately enhances the precision of discharging the liquid.

It is desired that arcuate grooves to communicate with the openings, respectively, be made in the sliding surface of the port member. The arcuate grooves have such lengths and assume such positions that three states sequentially and repeatedly occur as the valve member rotates. In the first state, two of the three plunger holes communicate with the arcuate grooves, respectively, and the remaining one plunger hole is closed off from the both arcuate grooves. In the second state, two of the three plunger holes communicate with the arcuate groove communicating with the inlet port and the remaining one plunger hole communicates with the arcuate groove communicating with the outlet port. In the third state, one of the three plunger holes communicates with the arcuate groove communicating with the inlet port and the remaining two plunger holes communicate with the arcuate groove communicating with the outlet port. It is also desired that the cam surface be designed to move the plungers in four alternative manners. In the first manner, when only one plunger hole communicates with the arcuate groove communicating with the inlet port, the plunger inserted in the plunger hole is moved away from the inlet port for a distance proportional to a rotation angle of the valve member. In the second manner, when only one plunger hole communicates with the arcuate groove communicating with the outlet port, the plunger inserted in the plunger hole is moved toward the outlet port for a distance proportional to the rotation angle of the valve member. In the third manner, when two plunger holes communicate with the arcuate groove communicating with the inlet port, the plunger inserted in the plunger holes are moved away from the inlet port for distances the sum of which is equal to the distance for which only one plunger is moved when the plunger hole holding this plunger communicates with the arcuate groove communicating with the inlet port. In the fourth manner, when two plungers holes communicate with the arcuate groove communicating with the outlet port, the plunger inserted in the plunger holes are moved toward to outlet port for distances the sum of which is equal to the distance for which only one plunger is moved when the plunger hole holding this plunger communicates with the arcuate groove communicating with the outlet port.

In the present invention, three plungers are used, arcuate grooves are made in the cam surface or the seal disk, two plunger holes can communicate with one groove at the same time, and the cam surface has a specific profile. Hence, the distance one plunger moves while the plunger hole holding the plunger is communicating with one arcuate groove is always equal to the sum of the distances two plungers move while the plunger holes holding these plungers are communicating with one arcuate groove. The rate at which the dispenser draws and discharges the liquid as the plungers are moved can, therefore, be proportional to the rotation angle of the valve member. As long as the valve member is rotated at a constant speed, the dispenser can discharge the liquid at a constant rate. Thus, the dispenser can be a pump that continuously discharge liquid without causing a pulsating motion of the liquid. If the rotation speed of the valve member is controlled, the amount of liquid discharged per unit time can be increased or decreased. That is, the rate of discharging the liquid can be easily controlled, too.

The port member may preferably comprise: a casing having an inlet port for drawing liquid and an outlet port for discharging the liquid; and a seal disk provided in the casing, having communication holes to communicate with the inlet port and the outlet port, respectively, and having a sliding surface in which the communication holes open. The valve member may preferably comprise: a valve disk having a sliding surface to contact the sliding surface of the seal disk, so arranged in the casing to rotate while abutting on the sliding surface of the seal disk, and having three plunger holes which extend parallel to an axis of the dispenser and which are arranged equidistantly around the axis of the dispenser; a plunger guide block enabled to rotate together with the valve disk and having three plunger holes which are coaxial with the three plunger holes of the valve disk, respectively; and a cam-follower guide block so arranged in the casing to rotate together with the valve disk and the plunger guide block and having three guide holes which extend parallel to an axis of the dispenser and which are arranged equidistantly around the axis of the dispenser. The plunger member may preferably comprise: three plungers inserted in the three plunger holes of the valve disk and the three plunger holes of the plunger guide block, to slide in the axial direction of the dispenser; and three cam followers inserted in the three guide holes of the cam-follower guide block, respectively, to slide in the axial direction of the dispenser. Each of the cam followers may have a cam-follower body arranged to contact, at one end, the associated plunger and having a semispherical recess in the other end, and one ball set in the semispherical recess to contact the cam surface. The coefficient of friction between the ball and the recess is smaller than a coefficient of friction between the cam surface and each ball. When the cam-follower guide block, plunger guide block and seal disk are rotated, the balls roll on the cam surface and the cam followers move back and forth in the axial direction of the dispenser, and the plungers are moved back and forth as the cam followers move back and forth.

In the dispenser thus constructed, the valve member comprises three discrete components, i.e., the valve disk, plunger guide block and cam-follower guide block. The valve disk contacts the liquid, whereas the plunger guide block and cam-follower guide block do not contact the liquid. Thus, the valve disk should be made of material, such as ceramic, which excels in chemical resistance. On the other hand, the plunger guide block and the cam-follower guide block can be made of synthetic resin that can be manufactured at low cost. This prevents an increase in the manufacturing cost of the dispenser and enables the dispenser to discharge various types of fluids. The dispenser can be used to apply various liquids such as adhesives and solvents.

The plunger member comprises plungers and cam followers, which are not formed integral. Hence, each plunger that contacts the liquid may be made of chemical-resistant material such as metal, and each cam follower may be made of material that achieves appropriate friction between the cam follower and the ball.

Since the plunger guide block holding the plungers and the cam-follower guide block holding the cam followers are discrete and separate components. This enhances the efficiency of making the components and the efficiency of assembling the dispenser.

Preferably, the dispenser may further comprise first bias portion for biasing the plungers toward the cam surface, causing the cam followers to abut on the cam surface and the balls to abut on the cam followers onto the cam surface.

If the dispenser comprises the first bias portion, the force with which the plungers abut on the cam surface can be appropriately adjusted.

If the plunger member comprises plungers and cam followers, it is desired that each plunger be biased toward the cam surface to abut on the cam follower and that the dispenser should have first bias portion for causing the ball of each cam follower to abut on the cam surface.

Two independent bias portion may be used, one for causing the ball of each cam follower to abut on the cam surface, and the other for causing each plunger to abut on the cam follower. Nonetheless, the first bias portion can replace these two bias portion. This reduces the number of components and, ultimately, lowers the manufacturing cost of the dispenser.

The first bias portion may be elastic members such as coil springs, which are provided in the plunger holes of the plunger guide block, respectively. In this case, each coil spring can bias one plunger toward the cam surface, making the plunger abut on one end of the cam follower. Then, the plunger can cause the ball of the cam follower to abut on the cam surface.

Moreover, the first bias portion can make the valve member abut on the port member if it is interposed between the valve member and the plungers. Thus, the force with which the valve member and the port member contact at their sliding surfaces can be adjusted by setting the bias of the first bias portion at a suitable value.

Preferably, the dispenser may further comprise second bias portion for biasing the valve member toward the port member, thereby to press the valve member onto the port member. Then, the valve member and port member can firmly contact each other at their sliding surfaces.

The first bias portion can be used as the bias portion for biasing the valve member toward the port member, without being modified at all. Alternatively, another bias portion, or the second bias portion, may be provided. If this is the case, the two bias portion can apply two pressures at the sliding surfaces of the valve member and port member, respectively. This increases the force with which the valve member and the port member contact at their sliding surfaces.

It is desired that the cam-follower guide block be shaped like a column having a small-diameter portion, a large-diameter portion, a stepped portion at the junction between the small- and large-diameter portions, a through hole made in the small- and large-diameter portions, holding a shaft of the drive portion and surrounded by the guide holes. It is also desired that the cam surface of the end cam should lie around the small-diameter portion of the cam-follower guide block.

In the dispenser of this structure, the end cam can be arranged to surround the small-diameter portion of the cam-follower guide block. This helps to save space.

DETAILED DESCRIPTION OF THE PREFERRED EMBODIMENTS

An embodiment of the present invention will be described, with reference to the accompanying drawings.

Figure 1:
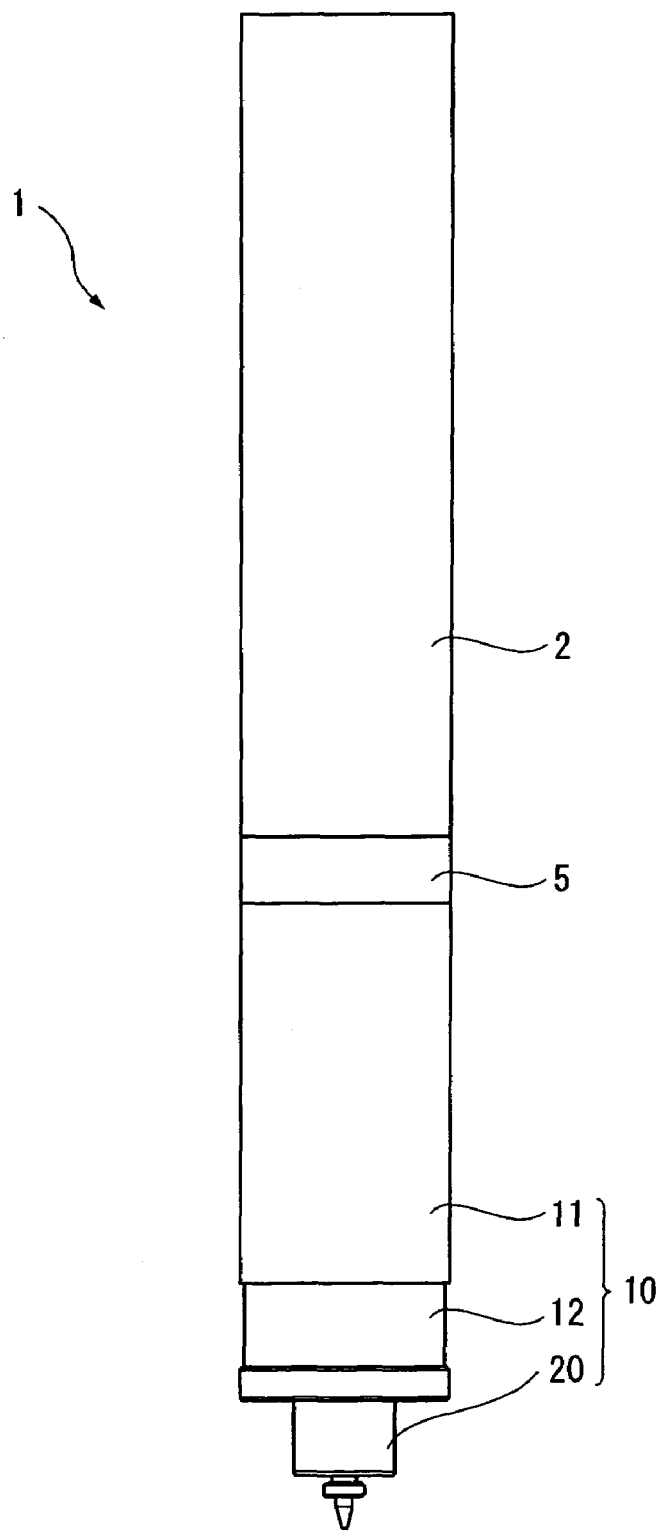
FIG. 1 is a front view showing an embodiment of the present invention.

FIG. 1 is a front view of a dispenser 1 that is an embodiment of the present invention.

As FIG. 1 shows, the dispenser 1 comprises a body 10, an end cam 5, and a motor case 2. The body 10, which is the casing of the dispenser 1, comprises a main cylinder 11, a connecting cylinder 12, and a port block 20. The connecting cylinder 12 has its one end connected to one end of the main cylinder 11. The port block 20 is connected to the other end of the connecting cylinder 12.

The motor case 2 is connected by an end cam 5 to the other end of the main cylinder 11 of the body 10. The motor case 2 contains a geared motor, which comprises a motor and reduction gears.

The port block 20, main cylinder 11, connecting cylinder 12, end cam 5 and motor case 2 are shaped like a square prism. The port block 20, main cylinder 11, connecting cylinder 12, and end cam 5 have four holes each, which are provided at the four corners, respectively. Four fastening screws (not shown) pass through these holes from the port block 20 and set in screw engagement with the motor case 2. Thus, the port block 20, main cylinder 11, connection cylinder 12, end cam 5 and motor case 2 are fastened together, forming an integral unit.

Figure 2:
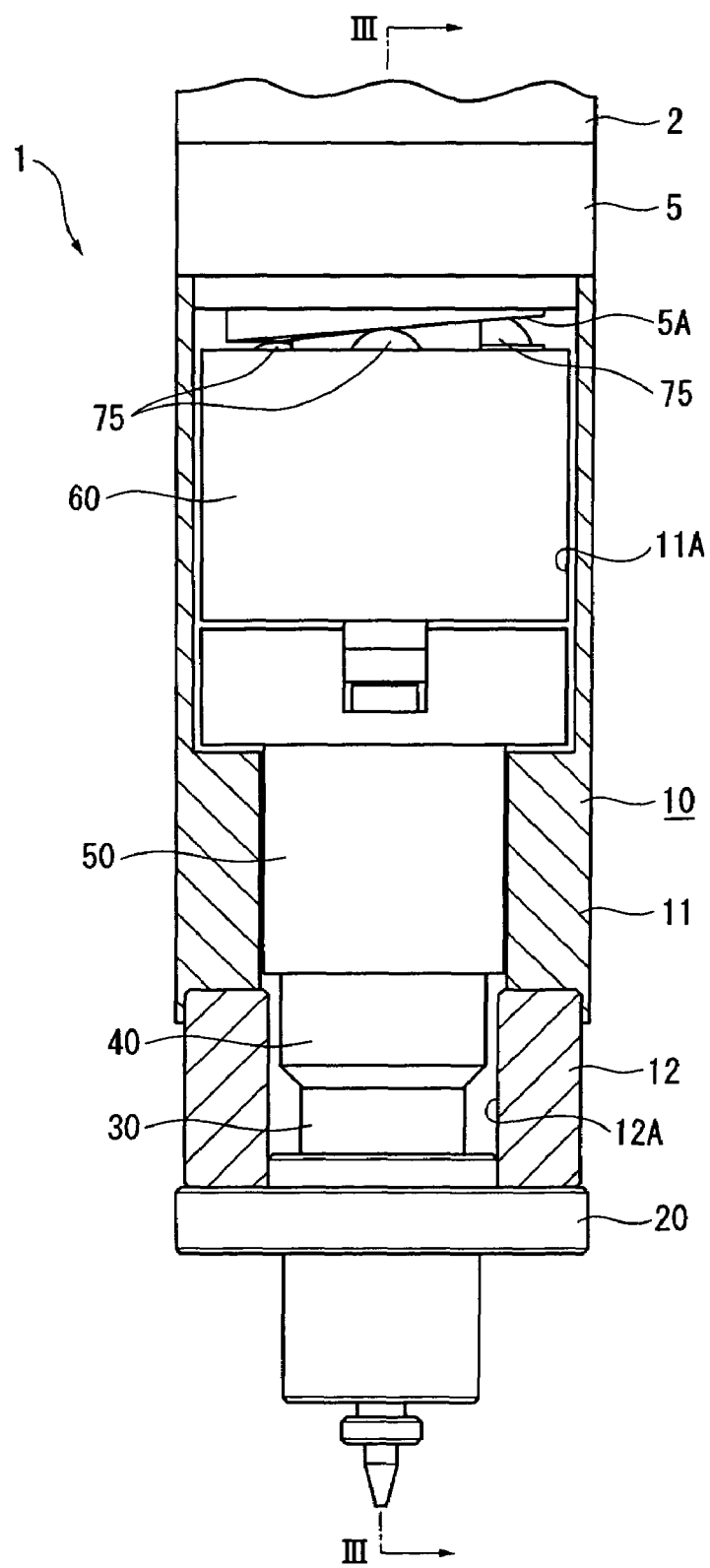
FIG. 2 is a cross-sectional view illustrating the major components of the embodiment of the invention.

As FIG. 2 shows, the main cylinder 11 has a through hole 11A that has a substantially circular cross section. Similarly, the connection cylinder 12 has a through hole 12A that has a substantially circular cross section. In the through holes 11A and 12A, a seal disk 30, a valve disk 40, a plunger guide block 50, and a cam-follower guide block 60 are arranged in axial alignment in the order mentioned, from the port block 20 toward the end cam 5. The valve disk 40, plunger guide block 50 and cam-follower guide block 60 constitute a valve member according to this invention.

Figure 3:
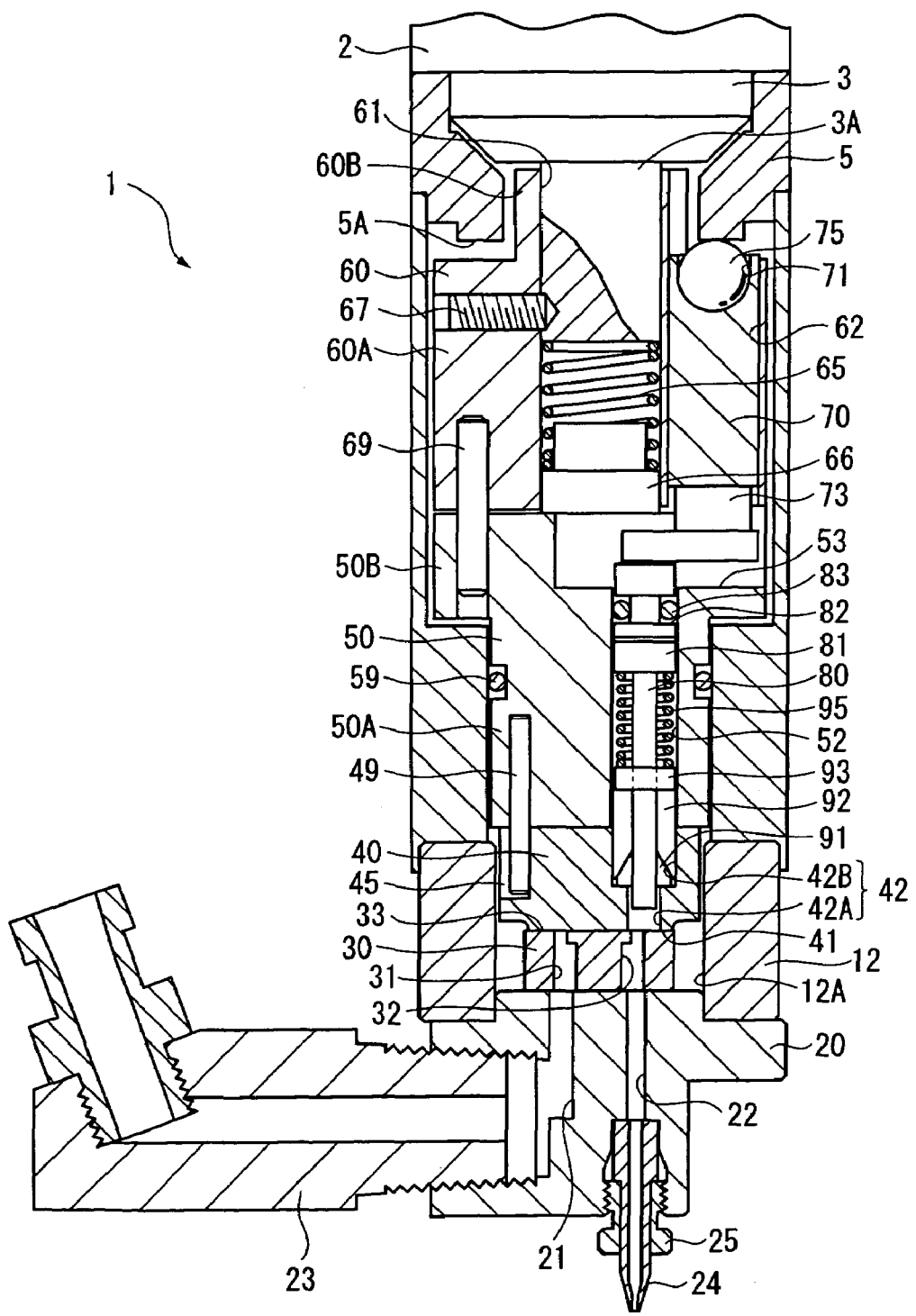
FIG. 3 is a cross-sectional view taken along line III—III shown in FIG. 2.

As illustrated in FIG. 3, the port block 20 has an inlet port 21 and an outlet port 22. Both ports 21 and 22 have a female screw. A liquid-supplying member 23 is set in the inlet port 21 in screw engagement therewith. The liquid-supplying member 23 can be coupled directly to a container that contains liquid such as adhesive or to a pipe connected to a tank that contains liquid. The liquid can therefore be supplied to the inlet port 21.

A nozzle 24 is removably connected to the outlet port 22 by a fastening screw 25. Hence, the liquid supplied through the outlet port 22 can be applied from the nozzle 24.

The seal disk 30 is made of hard material such as alumina ceramic. It is inserted in the through hole 12A of the connection cylinder 12. A pin (not shown) or the like holds the disk 30, preventing the same from rotating. The seal disk 30 has an inlet communication hole 31 and an outlet communication hole 32 that communicate with the inlet port 21 and outlet port 22 of the port block 20, respectively. That end of the seal disk 30, which faces away form the port block 20, has a sliding surface 33 that is smooth and flat. The communication holes 31 and 32 open at the sliding surface 33.

Figure 4:
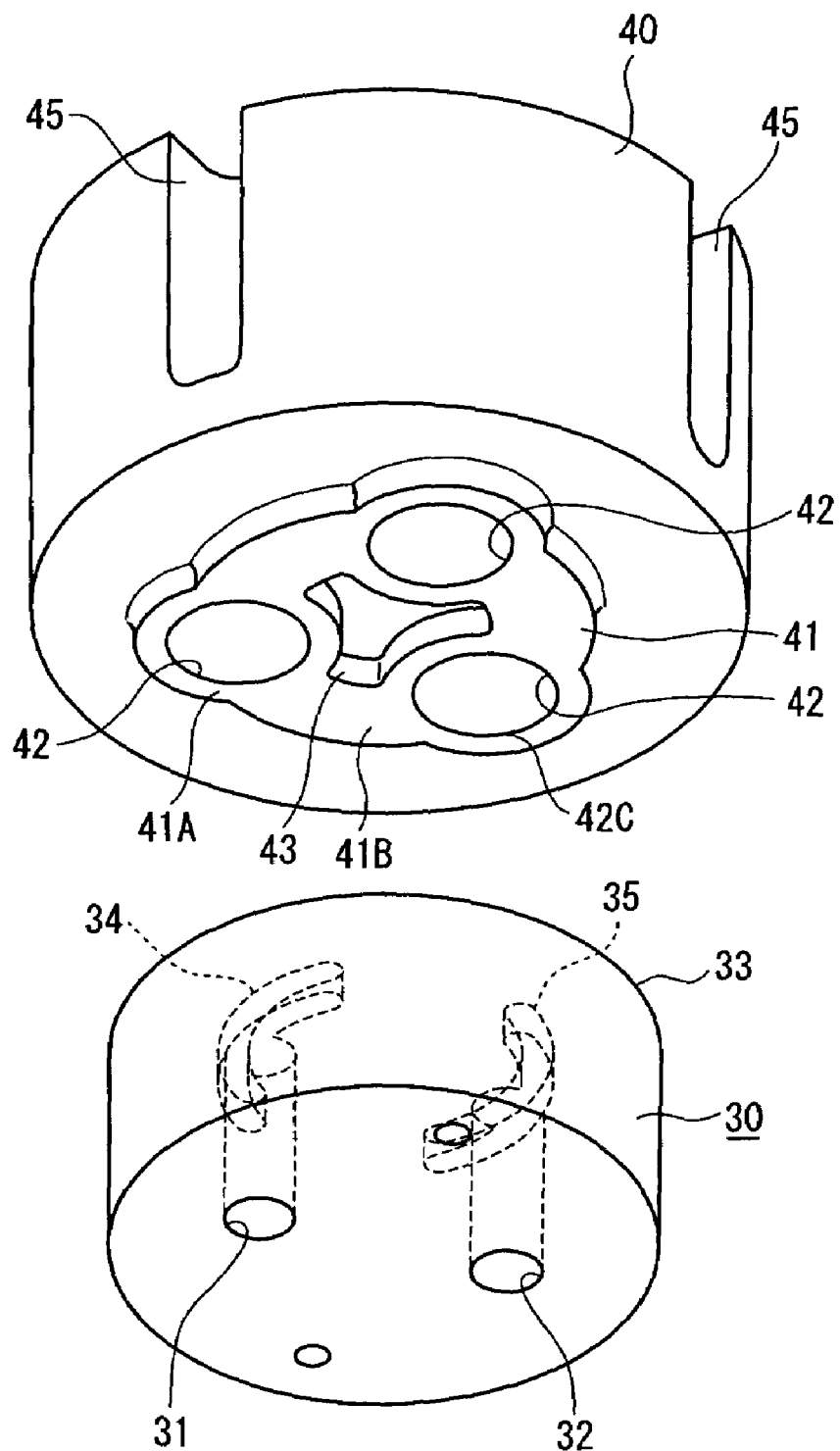
FIG. 4 is an exploded view depicting the seal disk and the valve disk, both incorporated in the embodiment.
Figure 5:
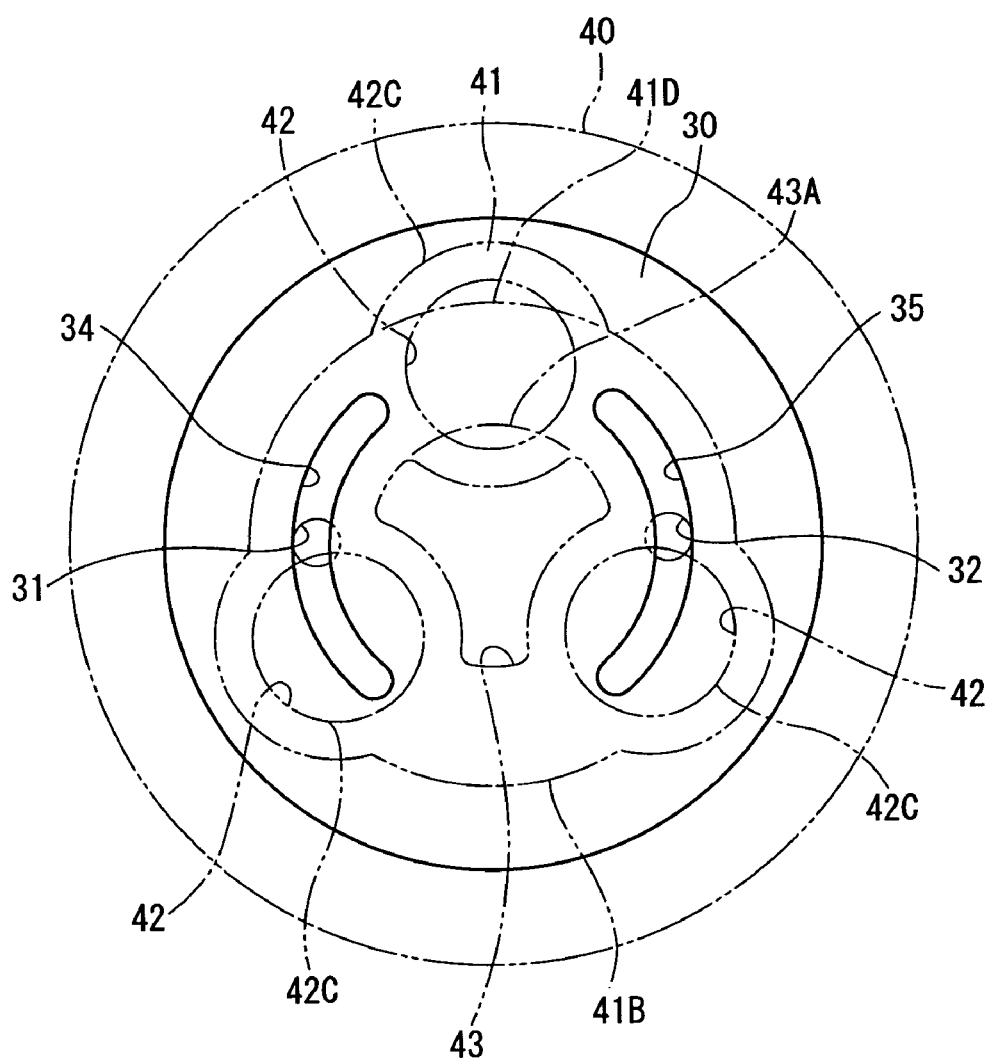
FIG. 5 is a schematic representation of the surface at which the seal disk and the valve disk slide one on the other.

As shown in FIGS. 4 and 5, those ends of the communication holes 31 and 32, which open at the sliding surface 33, are arcuate grooves 34 and 35.

Made in the sliding surface 33 of the seal disk 30, the arcuate grooves 34 and 35 communicate with the inlet port 21 and outlet port 22 of the port block 20, respectively. The port block 20 having the inlet port 21 and outlet port 22 and the seal disk 30 having the sliding surface 33 constitute a port member in the embodiment of the present invention.

The valve disk 40 is arranged, contacting the seal disk 30. The valve disk 40 is a circular cylinder and made of hard material such as alumina ceramic. The valve disk 40 has a sliding surface 41 at one end. The sliding surface 41 is set in sliding contact with the sliding surface 33 of the seal disk 30.

The valve disk 40 has three plunder holes 42 that are through holes. As best shown in FIG. 3, each plunger hole 42 is composed of a small-diameter hole 42A and a large-diameter hole 42B. The small-diameter hole 42A opens at the sliding surface 41. The large-diameter hole 42B faces away from the sliding surface 41.

Figure 6:
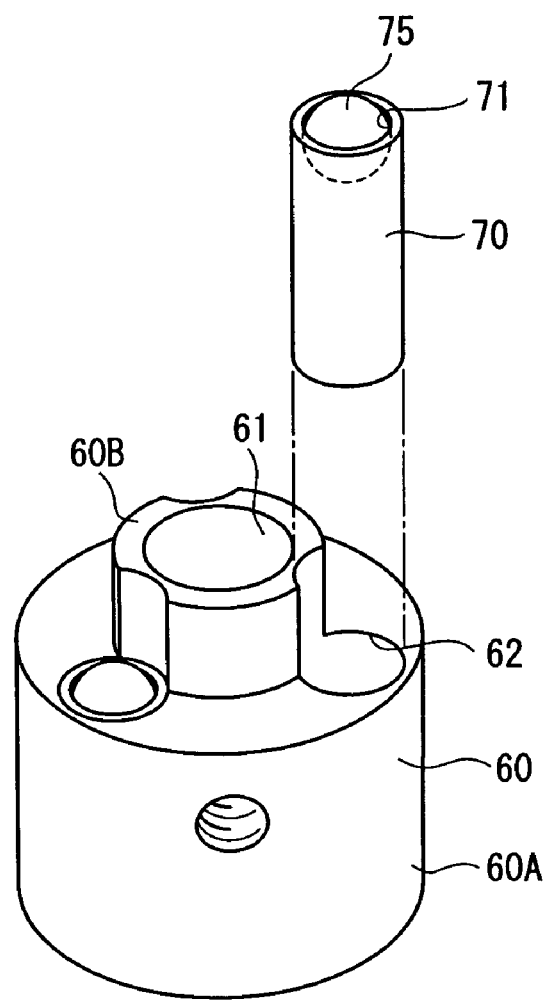
FIG. 6 is an exploded view showing the plunger guide block and the cam-follower guide block, both provided in the embodiment.
Figure 6:
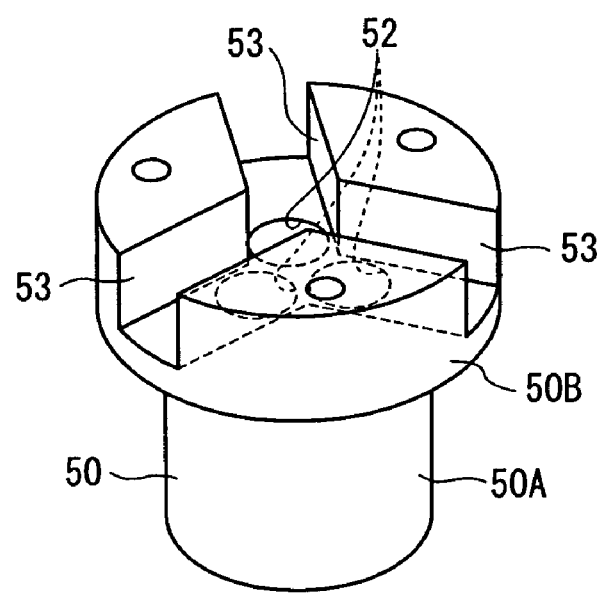

The plunger guide block 50 is made of synthetic resin such as oil-impregnated POM (polyacetal). The block 50 is arranged, contacting the valve disk 40. As FIGS. 3 and 6 depict, the block 50 is a circular cylinder, composed of a small-diameter portion 50A and a large-diameter portion 50B. The block 50 therefore has a stepped part at the junction between the small- and large-diameter portions 50A and 50B. The plunger guide block 50 has three plunger guide holes 52, which are coaxial with the plunger holes 42 of the valve disk 40, respectively. The plunger guide holes 52 holds a plunger each.

The valve disk 40 and the plunger guide block 50 can rotate together. This is because they are fastened to each other with three coupling pins 49. The pins 49 are inserted partly in three grooves 45 made in the valve disk 40 and partly in three holes made in the guide block 50. Note that the grooves 45 and the holes are spaced part at angular intervals of 120°. The plunger guide block 50 has an annular groove in its circumferential surface. The annular groove holds a seal 59 such as an O-ring.

As seen from FIGS. 3 and 6, three grooves 53 are cut in that end of the plunger guide block 50, which abuts on the cam-follower guide block 60. In other words, the grooves 53 are made in the upper end of the large-diameter portion 50B of the block 50. The grooves 53 extend in the radial direction of the block 50 and are spaced part at angular intervals of 120°. The plunger guide holes 52 mentioned above open in the bottoms of the grooves 53, respectively.

The cam-follower guide block 60 is arranged, contacting the plunger guide block 50. Like the plunger guide block 50, the cam-follower guide block 60 is made of synthetic resin such as oil-impregnated POM (polyacetal). It is substantially a circular cylinder composed of a large-diameter portion 60A and a small-diameter portion 60B. Thus, the block 60 has a stepped portion at the junction between the large- and small-diameter portions 60A and 60B. The cam-follower guide block 60 has a through hole 61 that extends in the axis of the block 60. The block 60 has three guide holes 62 that extend parallel to the through hole 61 and surround the through hole 61 as viewed from above. The through hole 61 passes through the small-diameter portion 60B and the large-diameter portion 60A. The guide holes 62 pass through the large-diameter portion 60A only. The small-diameter portion 60B has three shallow vertical grooves in its circumferential surface. The shallow vertical grooves are continuous to the upper ends of the guide holes 62, respectively. No step is made between each vertical groove and one guide hole 62.

The plunger guide block 50 and the cam-follower guide block 60 have three holes each, which are made in the surface at which the block contact the other block. These holes are spaced part at angular intervals of 120°. Three pins 69 are inserted partly in the three holes of the block 50 and partly in the three holes of the block 60. Coupled with the pins 69, the blocks 50 and 60 can rotate together.

The through hole 61 of the cam-follower guide block 60 holds the output shaft 3A of the motor 3 provided in the motor case 2. A screw 67 fastens the output shaft 3A to the cam-follower guide block 60.

Thus, the cam-follower guide block 60, plunger guide block 50 and valve disk 40 are fastened together with pins 49 and 69. Hence, they rotate all together when the motor 3 is driven, rotating the output shaft 3A.

In this embodiment the motor 3 is a geared motor that incorporates reduction gears. Nonetheless, it can be replaced by any other type of a motor, such as a servo motor or a stepping motor.

The through hole 61 of the cam-follower guide block 60 holds a coil spring 65 and a pushing member 66, too. The coil spring 65 is mounted on the output shaft 3A of the motor 3, biasing the pushing member 66 toward the port block 20 at all times.

The pushing member 66 abuts on one end of the plunger guide block 50. It pushes the plunger guide block 50, which in turn pushes the valve disk 40 onto the seal disk 30. As a result, the seal disk 30 and the valve disk 40 are pushed onto each other, and their sliding surfaces always remain in mutual contact. The coil spring 65 constitutes the second biasing portion in the present invention.

A columnar ball-holding member 70 is inserted in each guide hole 62 of the cam-follower guide block 60. The ball-holding members 70 can move back and forth in the guide holes 62. Each member 70 has a semispherical recess 71 in its end that faces the end cam 5. The recess 71 holds a ball 75.

A pushing plate 73 is secured to that end of each ball-holding member 70, which opposes the port block 20.

The pushing plate 73 is made of metal such as stainless steel. The plate 73 looks L-shaped as viewed from one side. It is positioned with its distal end located above the holes of the plunger guide block 50.

In the present embodiment, the ball-holding members 70 and the pushing plates 73 constitute the body of a cam follower. The main body, i.e., members 70 and plates 73, and the balls 75 constitute the cam follower.

Three plungers 80 are provided in the three plunger guide holes 52 of the plunger guide block 50, respectively. The plungers 80 abut at the proximal end on the pushing plates 73. The distal ends of the plungers 80 lie in the plunger holes 42 of the valve disk 40.

The proximal ends of the plungers 80 (i.e., the ends toward the cam-follower guide block 60) have a large-diameter portion 81 each. The large-diameter portions 81 have a diameter nearly equal to the diameter of the plunger guide holes 52. They are guided in their axial direction in the plunger guide holes 52. Each large-diameter portion 81 has a seal groove 82, in which a seal member 83 such as an O-ring is provided.

A projecting seal 91, a recessed seal 92 and a ring-shaped spring holder 93 are fitted in the distal-end section of each plunger 80, arranged in the order mentioned from the distal end of the plunger 80. A coil spring 95, which constitutes the first biasing portion, is interposed between the spring holder 93 and the large-diameter portion 81 of the plunger 80.

The projecting seal 91 and the recessed seal 92 lie in the large-diameter hole 42B of the plunger hole 42.

The projecting seal 91 is a conical member. It abuts on the bottom of the large-diameter hole 42B of the plunger hole 42. It has an axial hole, through which the plunger 80 extends. The recessed seal 92 has an axial hole and, hence is shaped like a hollow cylinder. It has a conical recess, in which the projecting seal 91 fitted. The plunger 80 extends through the axial hole of the recessed seal member 92.

The seals 91 and 92 are biased toward the bottom of the large-diameter hole 42B of the plunger hole 42, by the spring holder 93 that in turn is biased by the coil spring 95. Thus, the end of the projecting seal 91 is set in firm contact with the bottom of the large-diameter hole 42B. This ensures reliable sealing between the projecting seal 91 and the plunger hole 42. Held in the recessed seal 92 by virtue of the bias of the coil spring 95, the projecting seal 91 is biased inwards, tightening the plunger 80. Thus, reliable sealing is achieved between the plunger 80 and the projecting seal 91.

The seal provided in each plunger holes 42 may be an ordinary type one, such as O-rings, or may be one shaped like lips protruding from the holes 42.

Each coil spring 95 biases the ring-shaped spring holder 93 toward the distal end of the dispenser 1 (more precisely, toward the valve disk 40). The spring 95 abuts on the large-diameter portion 81 of the plunger 80, thus biasing the plunger 80, too, toward the proximal end of the dispenser 1 (more correctly, toward the cam-follower guide block 60). As a result, the large-diameter portion 81 of each plunger 80 is pushed onto the pushing plate 73 at all times.

Hence, the coil spring 95 biases the ball-holding member 70 secured to the pushing plate 73, always toward the proximal end of the dispenser 1. Each of the balls 75 therefore contacts the cam surface 5A of the end cam 5 at all times.

Thus, the balls 75 and ball-holding members 70 move back and forth in the axial direction of the dispenser 1, on the cam surface of the end cam 5 when the cam-follower guide block 60, plunger guide block 50 and valve disk 40 rotate as they are driven by the motor 3. The pushing plates 73 transmit the back-and-forth motion of the ball-holding members 70 to the plungers 8. Therefore, the ball-holding members 70, pushing plates 73 and balls 75 function as a cam follower. The cam follower (i.e., members 70, plates 73 and balls 75) and the plungers 80 constitute a plunger member in the present invention.

The coefficient of friction between each ball-holding member 70 and the ball 75 that the member 70 supports is smaller than the coefficient of friction between the ball 75 and the cam surface SA. To this end, the members 70, balls 75 and end cam 5 are made of specific materials, coated or not coated and, if coated, have a coating formed by a specific method.

More specifically, the balls 75 are made of hard metal such as tungsten carbide or the like. The end cam 5 is made of tool carbon steel and has been quench-hardened and polished. The cam surface SA is therefore very hard.

The ball-holding members 70 can be those made of resin or the like. Generally, ball-holding members are made of material softer than the balls 75, such as resin.

Nonetheless, the members 70 may be covered with, for example, a DLC coating that is as hard as the balls 75. In short, the end cam 5, it suffices if the ball-holding members 70 and balls 75 are made of such materials that the coefficient of friction between the members 70 and the balls 75 is smaller than the coefficient of friction between the cam surface 5A and the balls 75. Although soft compared with the balls 75, the ball-holding members 70 are rigid and strong enough not to be deformed, because they need to transmit the displacement of the cam surface SA to the plungers 80 via the balls 75.

At the sliding surface 41 of the valve disk 40, the plunger holes 42 of the valve disk 40 open at such positions as to oppose the two grooves 34 and 35 of the seal disk 30.

The plunger holes 42 and the grooves 34 and 35 are so designed in size and position that any plunger hole 42 communicates with the groove 34 or 35 while the plunger 80 of which is moving or sliding in its axial direction in the plunger hole 42 to draw or discharge the liquid, and any plunger hole 42 is closed off from the both groove 34 and 35 while the plunger 80 of which is not moving or sliding in its axial direction in the plunger hole 42.

Moreover, the sliding surface 33 of the seal disk 30 and the sliding surface 41 of the valve disk 40 are designed to contact each other at the smallest possible area. More precisely, the sliding surface 41 of the disk 40 contacts only the rims of the grooves 34 and 35. Thus, the valve disk 40 can seal the grooves 34 and 35, preventing the liquid 10 from leaking or minimizing the leakage of the liquid.

The plunger holes 42 have openings 42C at the sliding surface 41 of the valve disk 40. The sliding surface 33 of the seal disk 30 contacts the rims of the openings 42C, thereby closing and sealing the openings 42C of the plunger holes 42.

Thus, the sliding surface 41 of the valve disk 40 bulges from the body of the valve disk 40 as shown in FIG. 5, forming contact surfaces 41A around the openings 42C. Each contact surface 41A has a predetermined width. A recess 43 is made in the center part of the sliding surface 41. The rim of the recess 43 is spaced from the openings 42C by a prescribed distance.

The sliding surface 41 and the recess 43 have such contours as define contact surfaces 41B between the surface 41 and the openings 42C when the surface 41 contacts the rims of the grooves 34 and 35. Note that each of the contact surfaces 41B has a predetermined width.

That is, as illustrated in FIG. 4, too, the contour of the sliding surface 41 is defined by three small-radius arcs and three large-radius arcs. The small-radius arcs are spaced at a predetermined distance from the rims of the openings 42C, respectively.

The large-radium arcs are spaced at a predetermined distance from the outer rims of the arcuate grooves 34 and 35 when sliding surface 33 of the seal disk 30 contacts the rims of the openings 42C. Like the contour of the surface 41, the contour of the recess 43 is defined three large-radius arcs and three small-radium arcs. The large-radium arcs are spaced at a predetermined distance from the rims of the openings 42C, respectively, and the small-radium arcs are spaced from the inner rims of the arcuate grooves 34 and 35 when sliding surface 33 of the seal disk 30 contacts the rims of the openings 42C.

The sliding surface 33 of the seal disk 30 has such a size as to contact at least the contact surfaces 41A, 41B of the sliding surface 41. To be more specific, the outer rim of the sliding surface 33 is circular, and the sliding surface 33 has a radius (i.e., distance between the center to the circumference) larger than that of the sliding surface 41.

If the sliding surface 33 and the sliding surface 41 keeps contacting at a part, linking will likely occur. Since the recess 43 is made in the sliding surface 41 as shown in FIG. 5, those parts of the sliding surface 33 which lie within the locus 43A of the recess 43 are exposed in the recess 43 as the valve disk 40 rotates and do not continuously contact the sliding surface 41. Similarly, those parts of the sliding surface 33 which lie within the locus 41D of the contact surfaces 41B of the sliding surface 41 are located outside the contact surfaces 41B as the valve disk 40 rotates and do not contact the sliding surface 41. Further, those parts of the sliding surface 33 which lie between the loci 43A and 41D are exposed in the openings 42C of the plunger holes 42 as the valve disk 40 rotates and do not continuously contact with the sliding surface 41.

Hence, the sliding surface 33 has parts that usually contact the sliding surface 41 and cease to contact the surface 41 as the valve disk 40 rotates. The surfaces 33 and 41 are hardly linked to each other, while achieving good sealing.

As seen from FIG. 5, the grooves 34 and 35 and the openings 42C are arranged in a circle that is concentric to the seal disk 30 and the valve disk 40. The grooves 34 and 35 can therefore communicate with the plunger holes 42 when the valve disk 40 rotates.

The seals 59, 91 and 92 are made of appropriate material such as synthetic resin or rubber. In particular, the projecting seal 91, which is the primary seal that directly contacts the liquid, should be made of glass-containing tetrafluoroethylene copolymer or the like, which is resistant to chemicals and is hardly deformed. If the seal 91 is made of this material, it will serve to measure an amount of liquid accurately. The secondary seals, which only prevent the leakage of liquid, can be made of inexpensive material such as rubber, because they do not influence the measuring the amount of liquid even if they are deformed.

A drive portion is provided, in which the motor 3 rotates the cam-follower guide block 60. The pins 49 and 69 transmit the rotation of the cam-follower guide block 60 to the plunger guide block 50, which in turn transmits the rotation to the valve disk 40. Thus, the rotation of the output shaft 3A of the motor 3 is smoothly transmitted to the valve disk 40.

Figure 7:
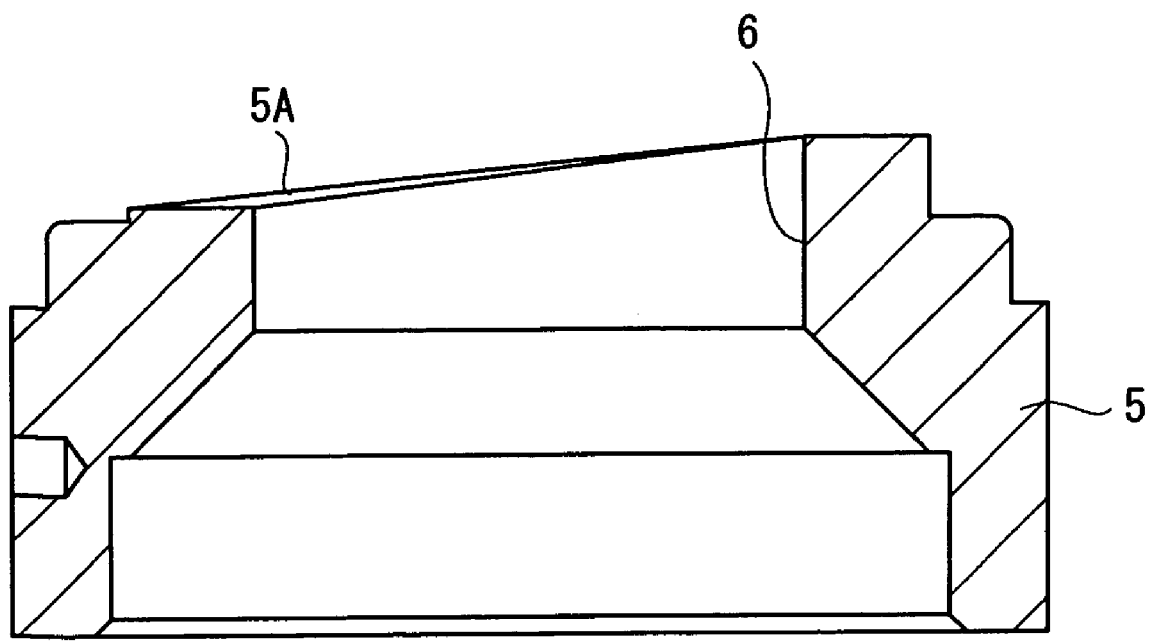
FIG. 7 is a cross-sectional view of the end cam used in the embodiment.

As FIG. 7 shows, the end cam 5 has a through hole 6, in which the output shaft 3A of the motor 3 rests. The cam surface 5A is provided at one end of the end cam 5. The end cam 5 is therefore a three-dimensional cam. The cam surface 5A has a specific profile that is shown in the cam-surface profile diagram of FIG. 8.

The operation of the present embodiment will be described below.

Before the dispenser 1 is operated, a tank filled with liquid is coupled to the liquid-supplying member 23. Alternatively, the tank may be connected to the liquid-supplying member 23 by a tube. If the dispenser 1 is attached to an arm of a robot used in the manufacture of semiconductor devices, the tube may restrict the motion of the robot arm. In view of this, it is desired that the tank be coupled directly to the liquid-supplying member 23.

The motor 3 is driven under this condition. The drive portion comprising the plunger guide block 50, the cam-follower guide block 60, and the like transmits the rotation of the output shaft 3A to the valve disk 40. The valve disk 40 is rotated in sliding contact with the seal disk 30.

As the valve disk 40 so rotates, the cam-follower guide block 60 rotates and the columnar ball-holding members 70 provided in the block 60 rotate, too. The balls 75 held in the ball-holding members 70 move forwards or backwards, in the same direction as the cam surface 5A moves in the axial direction. While so moving, due to the spring force from the coil spring 95, the balls 75 remain in contact with the cam surface 5A. More correctly, the balls 75 roll on the cam surface 5A and slide in the semispherical recesses 71 of the members 70. This is because the coefficient of friction between the balls 75 and the semispherical recess 71 is smaller than that between the balls 75 and the cam surface 5A.

The pushing plates 73 transmit the forward or backward motion of the ball-holding members 70 to the plungers 80. The plungers 80 therefore move forwards or backwards in its axial direction, in the respective plunder holes 42.

Figure 8:
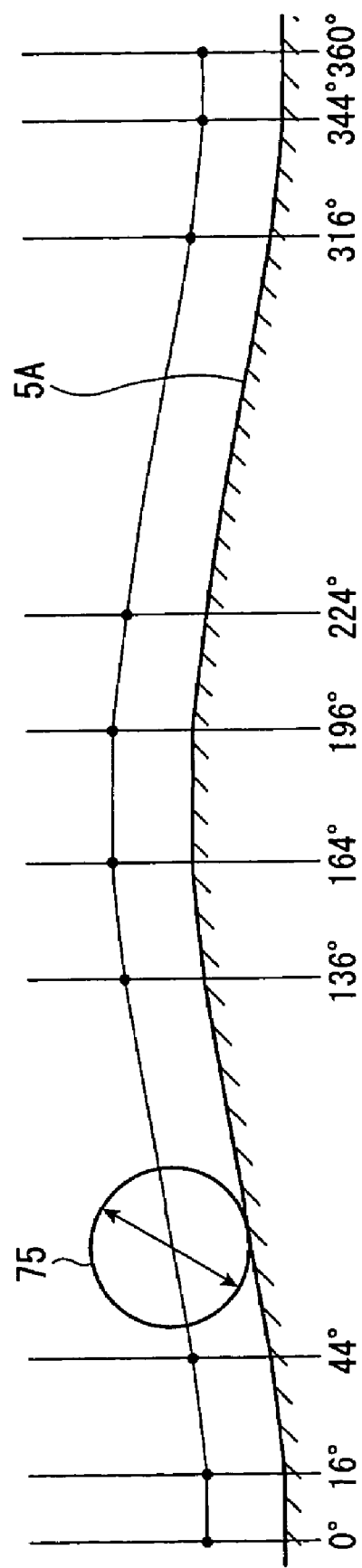
FIG. 8 is a diagram illustrating the surface profile of the end cam.

Since the cam surface 5A has an appropriate profile that is shown in FIG. 8, each plunger 80 can move upwards in FIG. 3 (toward the motor 3 provided in the proximal end of the dispenser 1). In other words, the plunger 80 can move away from the inlet port 21 of the port block 20. When any plunger 80 moves in this manner, a negative pressure develops in the plunger hole 42. As a result, the liquid to be supplied via the inlet port 21, inlet communication hole 31 and groove 34 is drawn into the plunger hole 42.

When any plunger 80 reaches its uppermost position, the plunger hole 42 moves away from the groove 34 that communicates with the outlet communication hole 32, toward the groove 35 that communicates with the communication hole 32 of the seal disk 30. While the plunger hole 42 is moving so, the plunger 80 moves toward the groove 35, without moving in its axial direction because the cam surface 5A is flat and not displaced in the axial direction of the end cam 5.

Assume that any plunger hole 42 moves to communicate, as shown in FIG. 3, with the groove 35 that communicates with the communication hole 32 of the seal disk 30. Then, the ball 75 rolling on the cam surface 5A and the ball-holding member 70 holding the ball 75 move toward the distal end of the dispenser 1 (that is, toward the port block 20). As the ball-holding member 70 moves so, the pushing plate 73 pushes the plunger 80 in the plunger hole 42 toward the distal end of the dispenser 1. Thus pushed, the plunger 80 forces the liquid into the outlet port 22 via the communication hole 32, in an amount proportional to the distance it is pushed by the pushing plate 73.

The plunger 80 discharges the liquid into the outlet port 22 while the plunger hole 42 is communicating with the arcuate groove 35. The discharging of the liquid completes shortly before the plunger hole 42 is disconnected from the groove 35. Once the plunger hole 42 moves away from the groove 35, the plunger 80 stops moving in its axial direction. The plunger 80 remains its position, owing to the cam surface 5A, until the plunger hole 42 moves to the groove 34 that communicates with the inlet port 21.

When the plunger hole 42 comes to the groove 34 again, the plunger 80 moves again toward the proximal end of the dispenser 1, by virtue of the cam surface 5A. As a result, the liquid is drawn from the inlet port 21. Thus, each plunger 80 is repeatedly moved up and down (toward the proximal and distal ends of the dispenser 1), each time drawing the liquid and then discharge the liquid.

Each plunger hole 42 communicates with the groove 34, with the groove 35 and with neither groove 34 nor groove 35, every time the valve disk 40 rotates through 360°. Thus, valve switching is accomplished.

The plungers 80 move back and forth in the same way, in the respective plunger holes 42. Hence, they draw and discharge the liquid in the same manner. As can be understood from FIG. 5, any two adjacent plunger holes 42 can communicate with the groove 34 or 35 at the same time. Therefore, the liquid can be continuously drawn from the liquid-supplying member 23 and discharged through the outlet port 22, in a predetermined amount.

Additionally, the liquid can be drawn and discharged without undergoing any pulsating motion. This is because the total amount of the liquid drawn from the liquid-supplying member 23 and discharged through the outlet port 22 is constant, due to the specific profile of the cam surface 5A.

The cam surface 5A has the profile shown in FIG. 8. In FIG. 8, the height of the cam surface 5A is plotted on the y-axis. That part of the surface 5A which lies nearest the motor 3 is at the lowest level (y=0), while that part of the cam surface 5A which lies farthest from the motor 3 is at the highest level (for example, y=1.68 mm in this embodiment). In FIG. 8, the rotation angle of the cam-follower guide lock 60 is plotted on the x-axis. In other words, the angle by which the cam surface 5A is rotated with respect to the ball 75 is plotted on the y-axis. The rotation angle is 0° when the ball 75 contacts that part of the cam surface 5A which lies at the lowest level (y=0). Note that FIG. 8, which is a cam-surface profile diagram, also shows the locus of the center of the ball 75.

As seen from the cam-surface profile diagram of FIG. 8, the cam surface 5A remains at the lowest level (y=0) as the rotation angle of the cam-follower guide block 60 increases from 0° to 16°. Hence, neither the ball 75 nor the plunger 80 moves in the axial direction of the plunger 80. The cam surface 5A then gradually rises as the rotation angle of the guide block 60 increases from 16° to 44°. As the cam surface 5A so rises, the ball 75 and the plunger 80 move at constant acceleration toward the distal end of the dispenser 1 (toward the port block 20). The cam surface 5A further rises as the rotation angle of the guide block 60 increases from 44° to 136°. The ball 75 and the plunger 80 further move at constant speed toward the distal end of the dispenser 1 (toward the port block 20). As the rotation angle of the guide block 60 increases from 136° to 164°, the cam surface 5A further rises, moving the ball 75 and the plunger 80 at constant acceleration toward the distal end of the dispenser 1 (toward the port block 20). As the rotation angle of the guide block 60 increases from 164° to 196°, the cam surface 5A remains at the highest level and neither the ball 75 nor the plunger 80 move in the axial direction of the plunger 80.

Then, the cam surface 5A gradually falls as the rotation angle of the guide block 60 increases from 196° to 224°. As the cam surface 5A so falls, the ball 75 and the plunger 80 move at constant acceleration in the axial direction of the plunger 80, toward the proximal end of the dispenser 1. Further, the cam surface 5A gradually falls as the rotation angle of the guide block 60 increases from 224° to 316°. As the cam surface 5A so falls, the ball 75 and the plunger 80 move at constant speed in the axial direction of the plunger 80, toward the proximal end of the dispenser 1. The cam surface 5A then gradually falls as the rotation angle of the guide block 60 increases from 316° to 344°. As the cam surface 5A falls, the ball 75 and the plunger 80 further move at constant acceleration in the axial direction of the plunger 80, toward the proximal end of the dispenser 1. As the rotation angle of the cam-follower guide block 60 increases from 344° to 360°, the cam surface 5A remains at the lowest level (y=0). Thus, neither the ball 75 nor the plunger 80 moves in the axial direction of the plunger 80.

Thus, the balls 75 and the plungers 80 are moved back and force in the axial direction of the dispenser 1 as the valve disk 40 and plunger guide block 50, while the balls 75 are rotating on the cam surface 5A and moving (or revolving) along the cam surface 5A. Since the grooves 34 and 35 both opening at the sliding surface 33 of the seal disk 30 are arcuate, the three plungers 80 operate as will be described below.

As the first ball 75 rolls on the cam surface 5A from the 44°-point to the 136°-point, only the plunger hole 42 holding the first plunger 80 that is associated with the first ball 75 communicates with the groove 35 that communicates with the outlet port 22. The liquid drawn into the plunger hole 42 holding the first plunger 80 therefore flows through the communication hole 32 and outlet port 22 and is discharged from the nozzle 24 when the first plunger 80 is moved at constant speed toward the distal end of the dispenser 1. Since the first plunger 80 is moved at constant speed, the distance it moves is proportional to the rotation angle of the first ball 75, or the rotation angle of the cam-follower guide block 60. Hence, the liquid is discharged from the nozzle 24 in a prescribed amount that accords with the rotation angle of the cam-follower guide block 60, or the rotation angle of the motor 3.

As the first ball 75 rolls on the cam surface 5A from the 136°-point to the 164°-point, not only the plunger hole 42 holding the first plunger 80, but also the plunger hole 42 holding the second plunger 80 communicates with the groove 35. While the first ball 75 is rolling from the 136°-point to the 164°-point, the second ball 75 associated with the second plunger 80 rolls on the cam surface 5A from the 16°-point to the 44°-point. This is because the three plungers 80 are spaced part at angular intervals of 120°.

The cam surface 5A is designed to make any plunger 80 move at constant acceleration. Thus, the second plunger 80 moves faster than the rotation angle increases, as the associated ball 75 moves from the 16°-point to the 44°-point, and the first plunger 80 moves slower than the rotation angle increases, as the first ball 75 moves from the 136°-point to the 164°-point. Further, the cam surface 5A is designed such that the sum of the distances the first and second plungers 80 move is equal to the distance the balls 75 move from the 44°-point to the 136°-point. It follows that the sum of the distances the two plungers 80 move is constant in the case where the plunger holes 42 holding the plungers 80, respectively, communicate with the groove 35. Thus, the amount of liquid discharged as the cam-follower guide block 60 rotates through a specific angle is the same as in the case the plungers 80 move at constant speed.

As the first ball 75 moves from the 164°-point to the 196°-point on the cam surface 5A, the plunger hole 42 holding the first plunger 80 is disconnected from the groove 35, communicating with neither the groove 34 nor the groove 35. This plunger hole 42 communicates with neither the outlet port 22 nor the inlet port 21. As a result, the valve is closed.

At this time, the second ball 75 lies between the 44°-point and the 164°-point on the cam surface 5A (more precisely, at the 74°-point). Thus, the liquid is discharged from the nozzle 24 at a constant rate because the second plunger 80 moves at constant speed.

The first ball 75 further moves from the 196°-point to the 224°-point on the cam surface 5A. Then, the plunger hole 42 holding the first plunger 80 comes to communicate with the groove 34 that communicates with the inlet port 21.

The first plunger 80 moves away from the motor 3, or from the inlet port 21, as the first ball 75 moves at constant acceleration on the cam surface 5A. A negative pressure develops in the plunger hole 42 holding the first plunger 80. The liquid is therefore drawn into the plunger hole 42 holding the first plunger 80 through the inlet port 21, communication hole 31 and groove 34, in an amount proportional to the distance the first plunger 80 moves. In the meantime, the second ball 75 moves from the 76°-point (=196°−120°) to the 104°-point (=224°−120°) on the cam surface 5A. As a result, the second plunger 80 moves at constant speed to the outlet port 22. Hence, the liquid is still discharged at a constant rate.

As the first ball 75 further moves from the 224°-point to the 316°-point on the cam surface 5A, only the plunger hole 42 holding the first plunger 80 communicates with the groove 34 that communicates with the inlet port 21. At this time, the first ball 75 and the first plunger 80 moves away from the inlet port 21 at constant speed. The first plunger 80 still serves to draw the liquid. Since the first plunger 80 moves at constant speed, the liquid is drawn into the plunger hole 42 in proportion to the rotation angle of the cam-follower guide block 60.

When the first ball 75 reaches the 256°-point, the second ball 75 and the third ball 75 reach the 136°-point and the 16°-point, respectively. As the first ball 75 moves from the 256°-point to the 284°-point, the first plunger 80 draws the liquid into the plunger hole 42. In the meantime, the second ball 75 moves from the 136°-point to the 164°-point and the third ball 75 moves from the 16°-point to the 44°-point. The second and third plungers 80 cooperate to discharge the liquid in the predetermined rate as the first and second plungers 80 do as described above.

As the second ball 75 moves from the 164°-point to the 196°-point, the second plunger hole 42 holding the second plunger 80 is disconnected from both grooves 34 and 35. The valve is therefore closed.

In the meantime, the first plunger 80 moves at the constant speed away from the inlet port 21, drawing the liquid into the first plunger hole 42 at a constant rate. The third plunger 80 moves at constant speed toward the outlet port 22, discharging the liquid from the nozzle 24 in the predetermined amount proportional to the rotation angle of the cam-follower guide block 60.

As the first ball 75 moves from the 316°-point to the 344°-point, the second ball 75 moves from the 196°-point to the 224°-point. Thus, not only the first plunger hole 42, but also the second plunger hole 42 holding the second plunger 80 communicates with the groove 34 mentioned above.

This part of the cam surface 5A which extends from the 196°-point to the 224°-point is designed to make the plunger 80 to move at constant acceleration. The second plunger 80 therefore moves faster than the rotation angle of the cam-follower guide block 60 increases. The part of the cam surface 5A, which extends from the 316°-point to the 344°-point is designed to make the first plunger 80 to move slower than the rotation angle of the cam-follower guide block 60 increases. Therefore, the sum of the distances the first and second plungers 80 move is equal to the distance either the first ball 75 or the second ball 75 moves from the 224°-point to the 316°-point. Thus, the sum of the distances the first and second plungers 80 move remains constant while both the first and second plunger holes 42 are communicating with the groove 34. These plungers 80 therefore cooperate to draw the liquid in proportion to the rotation angle of the cam-follower guide block 60 as in the case they move at constant speed. This renders it possible to draw the liquid at a prescribed amount.

Meanwhile, the third ball 75 and the third plunger 80 are moving at constant speed. Hence, the liquid is discharged from the third plunger hole 42 in proportion to the rotation angle of the cam-follower guide block 60.

As the first ball 75 further moves from the 334°-point to the 360°-point on the cam surface 5A, the first plunger hole 42 holding the first plunger 80 is disconnected from the groove 34. The first plunger hole 42 no longer communicates with the groove 34 or the groove 35. This means that the first plunger hole 42 communicates with neither the outlet port 22 nor the inlet port 21. The valve is therefore closed.

In this state, the second ball 75 and the second plunger 70 are moved away from the inlet port 21 at constant speed. The liquid is still drawn at a constant rate through the inlet port 21.

The third ball 75 and the third plunger 80 are approaching the outlet port 22 at constant speed. Thus, the liquid is still discharged from the nozzle 24 at a constant rate.

Then, the first ball 75 further moves on the cam surface 5A, returning to the 0°-point. The three balls 75 and the three plungers 80 repeatedly move in the manner specified above. The dispenser 1 can therefore continuously draw and discharge the liquid, causing no pulsating motion of the liquid.

In the dispenser 1 (i.e., plunger pump), the valve disk 40 is biased toward the seal disk 30 with two spring forces, keeping the sliding surfaces 33 and 41 in contact with a predetermined pressure. The valve disk 40 receives the first spring force from the coil spring 95, or the first bias portion, via the spring holder 93 and seals 92 and 91. The valve disk 40 receives the second spring force from the coil spring 65, or the second bias portion, via the plunger guide block 50.

Since the predetermined pressure keeps the sliding surfaces 33 and 41 in mutual contact, the gap between these surfaces 33 and 41 is reliably sealed. As indicated above, the sliding surfaces 33 and 41 have no parts at which they contact each other at all times; they are hardly linked to each other.

The present embodiment achieves the following advantages.

(Advantage 1)

As described above, each cam follower that abuts on the cam surface 5A comprises a ball-holding member 70 and a ball 75 held in the recess 71 of the member 70. This helps to miniaturize the driven unit that comprises the end cam 5 and the cam followers. If rollers are used as cam followers as in the conventional dispenser, axles must be provided on which the rollers can rotate freely. The axles protrude from the rods for driving the plungers 80. The diameter of revolution of the rollers is inevitably long. In the embodiment of the invention, each cam follower has a ball 75, not a roller. No roller axles need to be used. The diameter of revolution of the balls 75 is short. This can render the dispenser 1 small.

(Advantage 2)

In the conventional dispenser, the roller slips sideways on the flat cam. The flat cam must therefore be made of oil-impregnated resin to reduce the wear of the roller. If made of oil-impregnated resin, the flat cam may deform when the rollers are pressed onto it. If this happens, the stroke of the plunger will change from a desired value. Consequently, the dispenser fails to discharge a small amount of liquid with high precision.

In the embodiment of this invention, the balls 75 abut on the cam surface 5A, and the coefficient of friction between each ball 75 and the ball-holding member 70 holding the ball 75 is smaller than the coefficient of friction between the ball 75 and the cam surface 5A. Thus, a force, if exerted on the ball 75 to push it in a circumferential direction while the ball 75 is revolving on the cam surface 5A, is absorbed by the ball 75 because the ball 75 slips in the recess 71 of the ball-holding member 70. No lateral sliding will occur between the cam surface 5A and any ball 75. The balls 75 can roll on the cam surface 5A, without slipping thereon. The end cam 5 need not be made of oil-impregnated resin or the like. The end cam 5 is made of hard material such as metal, and the balls 75 are made of hard material, too. This minimizes a change, if any, in the stroke of each plunger 80. As a result, the dispenser 1 can discharge the liquid in a desired amount with high precision.

Moreover, each plunger 80 can be so moved to discharge the liquid without causing any pulsating motion of the liquid. The reason is that the plunger 80 moves back and forth as the ball 75 moves the ball-holding member 70 back and forth as it rolls on the cam surface 5A that has a specific a profile.

(Advantage 3)

The ball-holding members 70 are made of material softer than the balls 75 such as resin yet they would not deform because nearly the half of the balls 75 is in contact with the semispherical recesses 71, the force caused by sliding motion between the balls 75 and the recesses 71 is supported by large contact area of the recesses 71. Thus, the stroke of the plunger 80 does not change from the preset value and therefore the motion of the plunger 80 is correctly controlled. As indicated above, the cam surface 5A has a specific profile and the three plunger holes 42 that hold the three plungers 80 assume a specific positional relation with the grooves 34 and 35. Hence, the liquid can be drawn into and discharged from each plunger hole 42 in an amount that is proportional to the rotation angle of the motor 3, more precisely the rotation angle of the cam-follower guide block 60 or valve disk 40. It is possible to discharge the liquid from the nozzle 24 at a constant rate, without undergoing pulsating motion, only if the motor 3 is driven at constant speed.

The dispenser 1 can, therefore, acquire better operating characteristics than any conventional pump that has an inclined plate, too. In the pump with an inclined plate, the plunger is driven along the inclined plate. The slider contacts the inclined plate in plane contact and is inserted at one end in the spherical recess made in the plunger (i.e., piston). The inclined plate, which functions as cam has a completely surface. This renders it impossible for the pump to discharge liquid at a constant rate in proportion to the rotation angle of the motor. Further, it is required that the slider be lubricated to reduce the wear of the slider, all the time the pump is operated. Obviously, it is cumbersome to keep lubricating the slider.

In the dispenser 1, which is an embodiment of this invention, the end cam 5 is a three-dimensional cam. The dispenser 1 can therefore discharge the liquid at a constant rate that is proportional to the rotation angle of the cam-follower guide block 60. In addition, each ball 75 is hardly worn because the coefficient of friction between each ball 75 and the cam surface 5A is set at a particular value. The balls 75 need not be lubricated at all.

The amount in which to discharge the liquid for a unit time can be accurately adjusted to any desired value, merely by changing the rotational speed of the motor 3. The dispenser 1 is therefore easy to operate.

(Advantage 4)

In the present embodiment, each cam follower comprises only two components, i.e., ball-holding member 70 and ball 75. The cam follower is simpler in structure and can be manufactured at a lower cost than the cam follower used in the conventional dispenser, which includes a roller and a roller axle.

(Advantage 5)

In the embodiment described above, the sliding surface 41 of the valve disk 40 has a specific contour and the recess 43 is made in the sliding surface 41, and thereby eliminate the area of both sliding surfaces 33 and 41 that are in constant contact with each other, Even if the seal disk 30 and the valve disk 40 are pressed onto each other, with their sliding surfaces 33 and 41 sliding on each other, no linking will occur between the surfaces 33 and 41. That is, the disks 30 and 40 smoothly slide on each other.

(Advantage 6)

As described above, the recess 43 is made in the center part of the sliding surface 41. Dust or the like, if sticking to the lower end of the valve disk 40, will fall into the recess 43. The sliding surface 33 of the seal disk 30 and the sliding surface 41 of the valve disk 40 therefore remain in close contact, reliably preventing the liquid from leaking at the interface between the disks 30 and 40.

(Advantage 7)

The coil springs 95 that push the plungers 80 onto the ball-holding members 70 and the balls 75 onto the cam surface 5A are provided independently of the coil spring 65 that holds the sliding surfaces 33 and 41 in mutual contact. The pressure at which to the plungers 80 and balls 75 abut on the members 70 and surface 5A can therefore be easily adjusted, independently of the pressure at which the sliding surfaces 33 and 41 contact each other. Particularly, the coil spring 65 can hold the sliding surfaces 33 and 41 with a high pressure, keeping them in close contact.

Furthermore, the gap between each projecting seal 91 and the associated plunger 80 and the gap between the seal 91 and the small-diameter hole 42A of the plunger hole 42 can be reliably sealed, because the coil spring 95 biases both the projecting seal 91 and the recessed seal 92. This can reliably prevent the liquid from leaking.

(Advantage 8)

Made of alumina ceramic that is a hard material, not an elastic resin, the seal disk 30 and the valve disk 40 would not be deformed. This helps to control the amount in which the liquid is discharged at extremely high precision.

There are no components other than the seal disk 30 and valve disk 40, which are made of alumina ceramic, that contact the liquid, except the plungers 80, projecting seals 91 and port block 20. Thus, the dispenser 1 can excel in chemical resistance and can yet be made at a low cost, only if the plungers 80, projecting seals 91 and port block 20 are made of materials that are resistant to chemicals. The dispenser 1 can therefore discharge various kinds of liquids, such as liquid medicines, adhesives and solvents.

(Advantage 9)

The dispenser 1 is a plunger-pump type with a planar valve, and the valve disk 40 is rotated in sliding contact with the seal disk 30 to switch the port between the outlet port and the inlet port, both made in the sliding surface 33. The plungers 80 only need to move back and forth in the respective plunger holes 42. The plungers 80 need not rotate to select the outlet port or the inlet port as in D-cut plunger pumps. The plungers 80 can therefore be very slender, having a small diameter. The liquid can be discharged in an extremely small amount, because the amount is determined by the diameter and stroke of each plunger 80. The amount can be as small as a few micro-liters or a few nano-liters.

(Advantage 10)

One coil spring 95 functions as two biasing portion, one for pressing one plunger 80 on the pushing plate 73 of a ball-holding member 70, and the other for pressing one ball 75 on the cam surface 5A. This helps to reduce the number of components and ultimately to lower the manufacturing cost of the dispenser 1.

(Advantage 11)

The communication holes 31 and 32, both made in the seal disk 30, are closed by the sliding surfaces 33 and 41, which lie in sliding contact with the valve disk 40 and which are perpendicular to the axis of the dispenser 1. No sealing members such as O-rings or rubber seals need to be used to seal the interface between the seal disk 40 and the valve disk 40. If such a sealing member is used, it may deform to change the amount in which the dispenser 1 discharges the liquid. Without such sealing members, the dispenser 1 can discharge a small amount of liquid with high precision.

The present invention is not limited to the embodiment described above. Various changes and modifications that achieve the object of the invention fall within the scope of this invention.

For example, the seal disk 30 and the valve disk 40 can be made of other material than alumina ceramic. They may be made of other ceramic such as nitride silicon or of metal such as hard alloy.

The cam surface 5A of the end cam 5 may have a profile different from that shown in FIG. 8. For example, it may be a sine-curved cam surface that makes the plungers 80 move at the same acceleration while the two of the three plunger holes 42 communicate with the groove 34 or 35. In short, it suffices if the cam surface 5A is so designed that the sum of the distances that two of the three plungers 80 move is constant.

The dispenser 1 may not need to discharge the liquid at a constant rate, causing no pulsating motion of the liquid. If so, the cam surface 5A needs only to be designed to discharge the liquid in such a manner. In other words, it suffices to design the cam surface 5A to discharge the liquid in whatever way desired. Whichever profile the cam surface 5A has, the dispenser according to the invention can be small and can discharge the liquid with high precision. This is because each cam follower has a ball 75.

The coil spring 65 that is the second bias portion is not indispensable. The coil springs 95, which constitute the first bias portion, may also be used as the second bias portion. The force each coil spring 95 exerts acts on the valve disk 40, too, through the spring holder 93 and seals 92 and 91. This force may push the sliding surface 41 of the valve disk 40 to the sliding surface 33 of the seal disk 30. However, it would be better to use the coil spring 65 as in the embodiment described above; the coil spring 65 keeps the sliding surfaces 33 and 41 in close and firm mutual contact.

Two bias portions may be provided, one for abutting the balls 75 on the cam surface 5A and the other for abutting the plungers 80 on the ball-holding members 70.

Further, the grooves 34 and 35 made in the sliding surface 33 of the seal disk 30 need not be arcuate as in the embodiment described above. They may be elliptical, for example. They can have any shape so long as they communicate with the plunger holes 42 in the specific manner described above.

The contours of the sliding surface 41 of the valve disk 40 and the contour of the recess 43 made in the sliding surface 41 are not limited to those specified above. For example, the sliding surface 41 may have the same contour as the valve disk 40, so that steps are not formed as in the embodiment described above. In addition, the recess 43 may not be made in the sliding surface 41.

The valve disk 40, plunger guide block 50 and cam-follower guide block 60 may be formed integral. Nonetheless, the valve disk 40 and the cam-follower guide block 60 should better be separated. If the disk 40 and the block 60 are separate components as in the embodiment, the valve disk 40 can be made small. This helps to reduce the manufacturing cost of the valve disk 40, which is made of expensive, chemical-resistant material.

In the embodiment described above, the member 70 and the plunger 80 must be eccentric to each other because the plunger 80 has a smaller diameter than the output shaft 3A of the motor 3. If each ball-holding member 70 can be arranged coaxial with associated plunger 80, the plunger guide block 50 and the cam-follower guide block 60 may be formed integral. In this case, each ball-holding member 70 and the associated plunger 80, which constitute the plunger member, can be formed integral.

In the embodiment, the port block 20 and the seal disk 30 constitute a port member. Instead, the port member may be constituted by the port block 20 only. This is accomplished by providing the port block 20 with a sliding surface and by making the valve member abut on this sliding surface. In other words, the port member can be constituted by only the casing of the dispenser. If the port block 20 is made of alumina ceramic as the seal disk 30, it will be an expensive component. In view of this, the sliding surface of the port block 20 may be covered with a DLC coating. Then, the port block 20 can be made of metal that is inexpensive material. Since seal disk 30 need not be used, the manufacturing cost of the dispenser can be lowered.

Each bias portion is not limited to a coil spring. It may be another type of a spring, such as a conical coil spring. Further, the motor 3 may be selected from various types including a stepping motor, a servo motor, a synchronous motor, a DC motor, an induction motor, a reversible motor, an air motor, and the like.

The shape and structure of any other component are not limited to those specified above. They may be changed in various ways.

The dispenser 1 according to the invention is used not only to keep discharging liquid for a prescribed time at a constant rate. It may be employed also to discharge liquid in a specific manner by controlling, for example, the motor 3, to discharge a small amount of liquid into a line and mix it with the liquid flowing in the line, or to sample a small amount of liquid from a line.

Moreover, the plunger pump of this invention may be provided on a line through which a liquid is flowing and the motor 3 may be driven, so that the liquid pressure at the upstream may be balanced with that at the downstream. In this case, the flow rate of the liquid can be determined from the rotation angle of the motor or the number pulses applied to the motor. The plunger pump according to this invention is well designed, particularly to draw and discharge liquid in an extremely small amount, thus, it can be utilized as a high-precision flow meter.

What is claimed is:

1. A dispenser comprising:
a port member having an inlet port for drawing liquid, an outlet port for discharging the liquid, and a sliding surface in which openings is made, said openings communicating with the inlet port and outlet port, respectively;
a valve member having a sliding surface which is to contact the sliding surface of the port member, arranged to rotate with the sliding surface contacting the sliding surface of the port member and having three plunger holes which extend parallel to an axis of the dispenser and which are arranged equidistantly around the axis of the dispenser;
drive portion for rotating the valve member;
an end cam having a cam surface of a predetermined profile; and
three plungers inserted in the three plunger holes of the valve member, respectively, to move parallel to the axis of the dispenser;
wherein each of said plungers has a semispherical recess made in one end that opposes the cam surface, a ball is fitted in the semispherical recess to contact the cam surface, a coefficient of friction between the ball and the semispherical recess is smaller than a coefficient of friction between the ball and the cam surface, and the ball rolls on the cam surface when the valve member is rotated, causing the plunger to move parallel to the axis of the dispenser in accordance with the profile of the cam surface, wherein:

arcuate grooves to communicate with said openings, respectively, are made in the sliding surface of the port member;

the arcuate grooves have such lengths and assume such positions that three states sequentially and repeatedly occur as the valve member rotates, the first state being that two of the three plunger holes communicate with the arcuate grooves, respectively, and the remaining one plunger hole is closed off from the both arcuate grooves, the second state being that two of the three plunger holes communicate with the arcuate groove communicating with the inlet port and the remaining one plunger hole communicates with the arcuate groove communicating with the outlet port, and the third state being that one of the three plunger holes communicates with the arcuate groove communicating with the inlet port and the remaining two plunger holes communicate with the arcuate groove communicating with the outlet port; and the cam surface is designed to move the plungers in the following four alternative manners (a) to (d):

(a) when only one plunger hole communicates with the arcuate groove communicating with the inlet port, the plunger inserted in the plunger hole is moved away from the inlet port for a distance proportional to a rotation angle of the valve member;

(b) when only one plunger hole communicates with the arcuate groove communicating with the outlet port, the plunger inserted in the plunger hole is moved toward the outlet port for a distance proportional to the rotation angle of the valve member;

(c) when two plunger holes communicate with the arcuate groove communicating with the inlet port, the plungers inserted in the plunger holes are moved away from the inlet port for distances the sum of which is equal to the distance for which only one plunger is moved when the plunger hole holding this plunger communicates with the arcuate groove communicating with the inlet port; and (d) when two plunger holes communicate with the arcuate hole communicating with the outlet port, the plungers inserted in the plunger holes are moved toward to outlet port for distances the sum of which is equal to the distance for which only one plunger is moved when the plunger hole holding this plunger communicates with the arcuate groove communicating with the outlet port.

2. A dispenser comprising:

a port member having an inlet port for drawing liquid, an outlet port for discharging the liquid, and a sliding surface in which openings is made, said openings communicating with the inlet port and outlet port, respectively;

a valve member having a sliding surface which is to contact the sliding surface of the port member, arranged to rotate with the sliding surface contacting the sliding surface of the port member, and having three plunger holes which extend parallel to an axis of the dispenser and which are arranged equidistantly around the axis of the dispenser;

drive portion for rotating the valve member;

an end cam having a cam surface of a predetermined profile; and three plungers inserted in the three plunger holes of the valve member, respectively, to move parallel to the axis of the dispenser;

wherein each of said plungers has a semispherical recess made in one end that opposes the cam surface, a ball is fitted in the semispherical recess to contact the cam surface, a coefficient of friction between the ball and the semispherical recess is smaller than a coefficient of friction between the ball and the cam surface, and the ball rolls on the cam surface when the valve member is rotated, causing the plunger to move parallel to the axis of the dispenser in accordance with the profile of the cam surface, wherein:

said port member comprises:

a casing having an inlet port for drawing liquid and an outlet port for discharging the liquid; and a seal disk provided in the casing, having communication holes to communicate with the inlet port and the outlet port, respectively, and having a sliding surface in which the communication holes opens;

said valve member comprises:

a valve disk having a sliding surface to contact the sliding surface of the seal disk, so arranged in the casing to rotate while abutting on the sliding surface of the seal disk, and having three plunger holes which extend parallel to an axis of the dispenser and which are arranged equidistantly around the axis of the dispenser;

a plunger guide block enabled to rotate together with the valve disk and having three plunger holes which are coaxial with the three plunger holes of the valve disk, respectively; and a cam-follower guide block so arranged in the casing to rotate together with the valve disk and the plunger guide block and having three guide holes which extend parallel to an axis of the dispenser and which are arranged equidistantly around the axis of the dispenser; and said plunger member comprises:

three plungers inserted in the three plunger holes of the valve disk and the three plunger holes of the plunger guide block, enabled to slide in the axial direction of the dispenser; and three cam followers inserted in the three guide holes of the cam-follower guide block, respectively, enabled to slide in the axial direction of the dispenser, each of said cam followers has a cam-follower body arranged to contact, at one end, the associated plunger and having a semispherical recess in the other end, and one ball set in the semispherical recess to contact the cam surface, a coefficient of friction between the recess and each ball is smaller than a coefficient of friction between the cam surface and the ball, and when the cam-follower guide block, plunger guide block and valve disk are rotated, the balls roll on the cam surface and the cam followers move back and forth in the axial direction of the dispenser, and the plungers are moved back and forth as the cam followers move back and forth.

3. The dispenser according to claim 1, further comprising first bias portion for biasing the plunger member toward the cam surface, causing the balls to abut on the cam surface.

4. The dispenser according to claim 2, further comprises first bias portion for biasing the plungers toward the cam surface, causing the plungers to abut on the cam followers and the balls to abut cam surface.

5. The dispenser according to claim 1, further comprising second bias portion for biasing the valve member toward the port member, thereby to press the valve member onto the port member such that the sliding surfaces of the valve member and port member firmly contact each other.

6. The dispenser according to claim 2, wherein said cam-follower guide block is shaped like a column having a small-diameter portion, a large-diameter portion, a stepped portion at the junction between the small- and large-diameter portions, a through hole made in the small- and large-diameter portions, holding a shaft of the drive portion and surrounded by the guide holes, and the cam surface of said end cam lies around the small-diameter portion of the cam-follower guide block.

* * * * *